United States Patent
Mollat et al.

(10) Patent No.: US 7,466,009 B2
(45) Date of Patent: Dec. 16, 2008

(54) METHOD FOR REDUCING DISLOCATION THREADING USING A SUPPRESSION IMPLANT

(75) Inventors: Martin Mollat, McKinney, TX (US); Tathagata Chatterjee, Allen, TX (US); Henry L. Edwards, Garland, TX (US); Lance S. Robertson, Rockwall, TX (US); Richard B. Irwin, Richardson, TX (US); Binghua Hu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 319 days.

(21) Appl. No.: 11/422,221

(22) Filed: Jun. 5, 2006

(65) Prior Publication Data

US 2007/0281433 A1 Dec. 6, 2007

(51) Int. Cl.
*H01L 29/93* (2006.01)
*H01L 23/62* (2006.01)

(52) U.S. Cl. .............................. 257/577; 257/E21.608; 257/260; 257/360

(58) Field of Classification Search ................. 257/260, 257/360, 577, 506, E23.001, E21.608, E29.342, 257/E23.002, E29.027
See application file for complete search history.

(56) References Cited

U.S. PATENT DOCUMENTS

| | | | | |
|---|---|---|---|---|
| 4,013,483 A | * | 3/1977 | Nuzillat et al. | 438/11 |
| 4,395,723 A | * | 7/1983 | Harari | 257/260 |
| 4,737,469 A | * | 4/1988 | Stevens | 438/170 |
| 4,929,568 A | * | 5/1990 | Beasom et al. | 438/176 |
| 5,296,727 A | * | 3/1994 | Kawai et al. | 257/260 |
| 5,500,546 A | | 3/1996 | Marum et al. | |
| 6,130,144 A | * | 10/2000 | Verret | 438/542 |
| 6,218,222 B1 | * | 4/2001 | Brown et al. | 438/167 |
| 2004/0217425 A1 | * | 11/2004 | Brodsky et al. | 257/360 |
| 2004/0262696 A1 | * | 12/2004 | Ronsisvalle | 257/378 |
| 2005/0006720 A1 | * | 1/2005 | Ejiri et al. | 257/532 |
| 2005/0253216 A1 | * | 11/2005 | Tsuchiko | 257/491 |
| 2007/0145520 A1 | * | 6/2007 | Soma et al. | 257/506 |
| 2007/0281433 A1 | * | 12/2007 | Mollat et al. | 438/380 |

* cited by examiner

*Primary Examiner*—Walter L Lindsay, Jr.
(74) *Attorney, Agent, or Firm*—Wade J. Brady; Frederick J. Telecky, Jr.

(57) ABSTRACT

The present invention provides a method for manufacturing a semiconductor device. In one embodiment, the method for manufacturing the semiconductor device includes a method for manufacturing a zener diode, including among others, forming a doped well within a substrate and forming a suppression implant within the substrate. The method for manufacturing the zener diode may further include forming a cathode and an anode within the substrate, wherein the suppression implant is located proximate the doped well and configured to reduce threading dislocations.

11 Claims, 3 Drawing Sheets

METHOD FOR REDUCING DISLOCATION THREADING USING A SUPPRESSION IMPLANT

TECHNICAL FIELD OF THE INVENTION

The present invention is directed, in general, to dislocation threading and, more specifically, to a method for reducing dislocation threading using a suppression implant.

BACKGROUND OF THE INVENTION

In integrated circuit fabrication, dopants are frequently introduced into semiconductor substrates to provide the semiconductor substrate with certain electrical characteristics. High-energy implants (e.g., implants using an implant energy in excess of about 150 keV) are an increasingly important method for introducing dopants into semiconductor substrates. At these high energies, the dopant profile is tailored to provide the desired concentration of dopant within the desired distance from the surface of the semiconductor substrate.

It is well recognized, however, that such high-energy implants, particularly when used in combination with high dopant doses, may lead to certain long-term undesirable defects. For instance, it is well recognized that high-energy implants tend to form long dislocation dipoles (also referred to as threading dislocations) after a furnace anneal of the implanted substrates. These dislocations are typically generated in the substrate at the approximate depth of the mean projected range of the implanted ions. Moreover, the dislocations tend to migrate to the substrate surface and have been found to cause high junction leakage currents, Gate Oxide Integrity issues and other electrical problems.

It has been observed that the threading dislocation density caused by high energy Boron implants is much greater than other implant species and that the threading dislocations are generated under a variety of different anneal conditions (e.g., a post implant anneal conducted at 900° C. for about 30 minutes). It has been observed that the threading dislocation density has strong dose dependence, with a maximum defect density observed at Boron doses ranging from about $5E13$ atoms/cm$^2$ to about $2E14$ atoms/cm$^2$, with a peak defect density at a Boron dose of about $1E14$ atoms/cm$^2$.

The industry has attempted to address these threading dislocations in a number of different ways. First, the industry attempted reducing or increasing the Boron implant dose to a value outside of the range that brings about the aforementioned maximum defect density. This method poses several difficulties or barriers to include requiring devices or components to operate within a different doping profile (e.g. dopant well) than intended or designed; this is especially true to High Voltage devices and components where the well doping sets breakdown characteristics for the component. Second, the industry proposed a two-step anneal wherein the substrate is first annealed at a lower temperature for a longer time period and then annealed at the typical temperature. The two-step anneal reduced the density of threading dislocations in Boron-implanted substrates, however, the 20 or so hour anneal is simply too long to be practical in commercial processes for semiconductor processing.

Consequently, processes that reduce the threading dislocations caused by high-energy implants and that are compatible with commercial processes for device fabrication are sought.

SUMMARY OF THE INVENTION

To address the above-discussed deficiencies of the prior art, the present invention provides a method for manufacturing a zener diode and a method for manufacturing a semiconductor device. In one embodiment, the method for manufacturing the zener diode includes, among others, forming a p-type well within a substrate and forming a Fluorine implant within the substrate. The method for manufacturing the zener diode may further include forming a cathode and an anode within the substrate, wherein the Fluorine implant is located proximate the p-type well and configured to reduce threading dislocations.

In an alternative embodiment, the method for manufacturing the semiconductor device includes forming a doped well within a substrate, and forming a suppression implant within the substrate using an energy ranging from about 120 KeV to about 540 KeV and a dose of at least about $1.5E14$ atoms/cm$^2$, wherein the suppression implant is located proximate the doped well.

An alternative embodiment provides a zener diode. For instance, the zener diode may include a p-type well located within a substrate and a Fluorine implant located within the substrate proximate the p-type well and configured to reduce threading dislocations. The zener diode in this embodiment may further include a cathode and an anode located within the p-type well.

A semiconductor device is also provided by the present invention. The semiconductor device, without limitation, may include a doped well located within a substrate, one or more active junctions located within the doped well, and a suppression implant located within the doped well. In one embodiment, a peak concentration of the suppression implant is located between a peak concentration of the p-type well and the one or more active junctions.

The present invention further provides a voltage protection circuit. The voltage protection circuit may include: 1) an input pad, 2) one or more zener diodes electrically coupled to the input pad, the one or more zener diodes configured to clamp the input voltage, and 3) a circuit for receiving the input voltage or the clamped input voltage. In one embodiment, the one or more zener diodes are substantially similar to those discussed in the paragraph directly above.

BRIEF DESCRIPTION OF THE DRAWINGS

For a more complete understanding of the present invention, reference is now made to the following descriptions taken in conjunction with the accompanying drawings, in which.

DETAILED DESCRIPTION

The present invention is based, at least in part, on the recognition that suppression implants may be used proximate doped wells, particularly p-type Boron doped wells, to reduce (e.g., suppress) threading dislocations that may form therein and cause leakage paths or other physical damage to the active device area. More specifically, the present invention has recognized that the placement of a suppression implant (e.g., a Fluorine implant in one embodiment) between the active junctions in the doped well and a peak concentration of the doped well dopant, reduces or suppresses the aforementioned threading dislocations. The present invention has further recognized that the placement of the suppression implant within about 1 micron from the peak concentration of the doped well dopant, and more specifically within about 0.5 microns from the peak concentration of the doped well dopant, may provide superior results.

Figure 1:
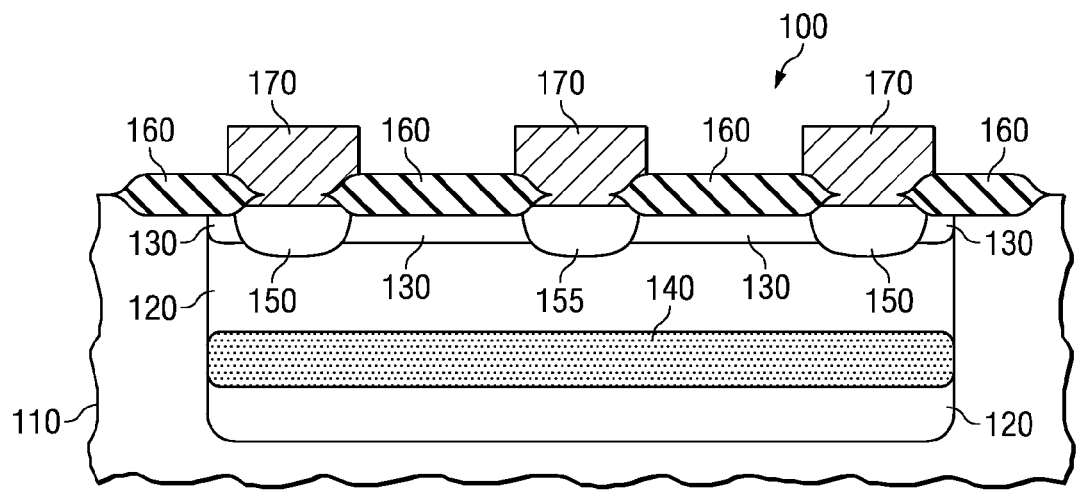
FIG. 1 illustrates a sectional view of a semiconductor device manufactured in accordance with the principles of the present invention.

Turning now to FIG. 1, illustrated is a sectional view of a semiconductor device 100 manufactured in accordance with the principles of the present invention. The semiconductor device 100 initially includes a substrate 110. Located within the substrate 110 in the embodiment of FIG. 1 is a doped well region 120. The doped well region 120 may comprise various different dopants and configurations and remain within the purview of the present invention. However, in one particular embodiment, the doped well region 120 is a p-type doped well region, and more specifically a Boron doped well region.

Located within the substrate 110 in the embodiment of FIG. 1 is an implant 130. The implant 130, which in one embodiment is an n-type dopant such as arsenic, is positioned within the doped well region 120. The implant 130, as opposed to the doped well region 120, is a very shallow implant, for example extending on the order of about 0.4 microns into the substrate 110.

The semiconductor device 100 of FIG. 1, in accordance with the inventive aspects of the present invention, includes a suppression implant 140 in the substrate 110. In FIG. 1, the suppression implant 140 is located between a peak concentration of the doped well region 120 and active junctions 150, 155, which will be discussed more fully below. In one particularly advantageous embodiment, the suppression implant 140 is located within about 1 micron of the peak concentration of the doped well region 120. In another particularly advantageous embodiment, the suppression implant 140 is located within about 0.5 microns of the peak concentration of the doped well region 120. It has been observed that positioning the suppression implant 140 within about 1 micron provides enhanced threading dislocation reduction or suppression. It is believed that reducing the 1 micron to about 0.5 microns or less provides even superior threading dislocation reduction or suppression.

The suppression implant 140, when manufactured consistent with the principles of the present invention, may comprise certain different dopants. For example, in one embodiment the suppression implant 140 comprises a group 17 element (e.g., I.U.P.A.C. convention standard) such as Fluorine, the suppression implant 140 thus being a Fluorine implant. Such Fluorine suppression implants have been subjected to significant testing, and have in turn been found to substantially reduce or suppress the aforementioned threading dislocations.

Nevertheless, other group 17 elements might also be found to provide the same advantageous results as the Fluorine implant. In addition to the group 17 elements, other separate embodiments might exist wherein the suppression implant includes a group 14 element (e.g., Carbon implant, Silicon implant, etc.), a group 15 element (e.g., Nitrogen implant), or a group 18 element (e.g., Neon implant, Argon implant, etc.) Combination suppression implants, for example by combining any two or more of the previously listed elements, have not been tested, but might also work.

The semiconductor device 100 of FIG. 1 further includes one or more active junctions 150, 155 located within the substrate 110. In the embodiment shown, the active junctions 150 are anodes and the active junction 155 is a cathode, as might be used in a zener diode. Thus, in the embodiment of FIG. 1 the semiconductor device 100 is configured as a zener diode. Other embodiments for the semiconductor device 100, however, also exist. For example, the semiconductor device 100 might also be a metal oxide semiconductor (MOS) device. In this embodiment the active junctions 150, 155 would be configured as source/drain regions of the MOS device. Alternatively, the semiconductor device 100 might be a bipolar transistor. In this embodiment the active junctions 150, 155, would be configured as at least one of a collector, base or emitter of the bipolar transistor.

Likewise, the semiconductor device 100 might be other p-n diodes, as opposed to strictly a zener diode.

The semiconductor device 100 of FIG. 1 experiences less threading dislocations than a conventional semiconductor device not having the discussed suppression implants. Because the semiconductor device 100 has reduced or suppressed threading dislocations, the possibility for leakage paths is greatly reduced.

Figure 2:
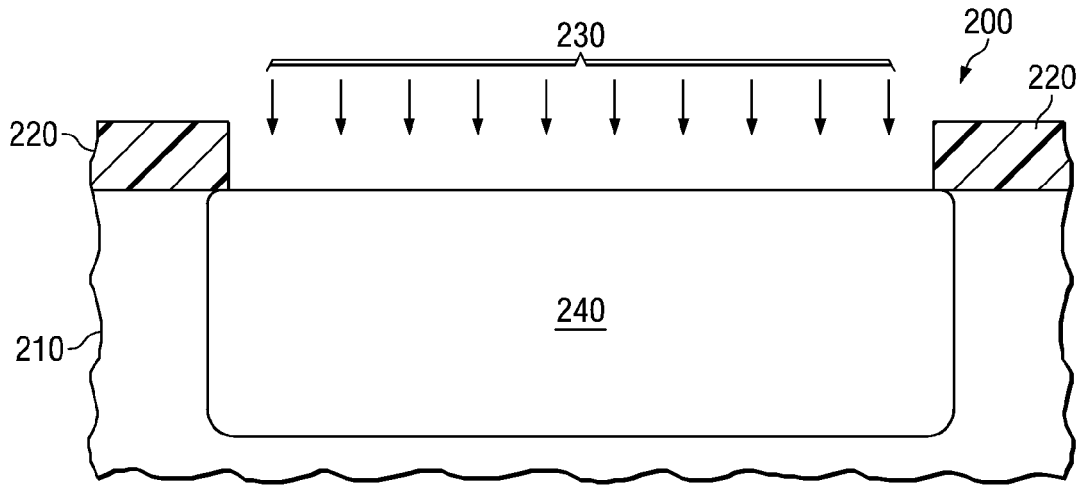
FIGS. 2 thru 7 illustrate sectional views showing how one might, in an embodiment, manufacture a semiconductor device in accordance with the principles of the present invention.

Turning now to FIGS. 2-7, illustrated are sectional views illustrating how one might, in an advantageous embodiment, manufacture a semiconductor device similar to the semiconductor device 100 depicted in FIG. 1. FIG. 2 illustrates a sectional view of a partially completed semiconductor device 200 manufactured in accordance with the principles of the present invention. The semiconductor device 200 of FIG. 2 includes a substrate 210. The substrate 210 may, in an exemplary embodiment, be any layer located in the semiconductor device 200, including a wafer itself or a layer located above the wafer (e.g., epitaxial layer). In the embodiment illustrated in FIG. 2, the substrate 210 is a p-type substrate; however, one skilled in the art understands that the substrate 210 could be an n-type substrate without departing from the scope of the present invention. In such a case, each of the dopant types described throughout the remainder of this document might or might not be reversed. For clarity, no further reference to this opposite scheme will be discussed.

Located within the substrate 210 is a doped well region 240. The doped well region 240 may comprise various different dopants while remaining within the purview of the present invention. Nevertheless, in the embodiment of FIG. 2, the doped well region 240 is a p-type doped well region, and more specifically a Boron doped well region.

The doped well region 240 may be formed using conventional or other processes. Accordingly, a conventionally patterned photoresist layer 220 and implant dose 230 could be used to form and define the doped well region 240. For example, using the photoresist layer 220 and implant dose 230, the doped well region 240 could be implanted with a Boron dopant dose ranging from about 5E13 atoms/cm$^2$ to about 2E14 atoms/cm$^2$. Such a Boron dose might be implanted using an energy ranging from about 100 keV to about 500 keV, among others. This results in the doped well region 240 having a peak dopant concentration ranging from about 5E16 atoms/cm$^3$ to about 5E18 atoms/cm$^3$. The peak dopant concentration, in the aforementioned embodiment, would likely be located from about 1.2 microns to about 2.0 microns from the surface of the substrate 210.

The term peak concentration, as used herein, means the highest dopant concentration of a particular dopant located within a doped region. For instance, in the Boron doped well region, the peak concentration would be the highest Boron concentration located therein. In turn, the location of the peak concentration, as used herein, means the depth into the substrate 210 that the highest dopant concentration is located.

Figure 3:
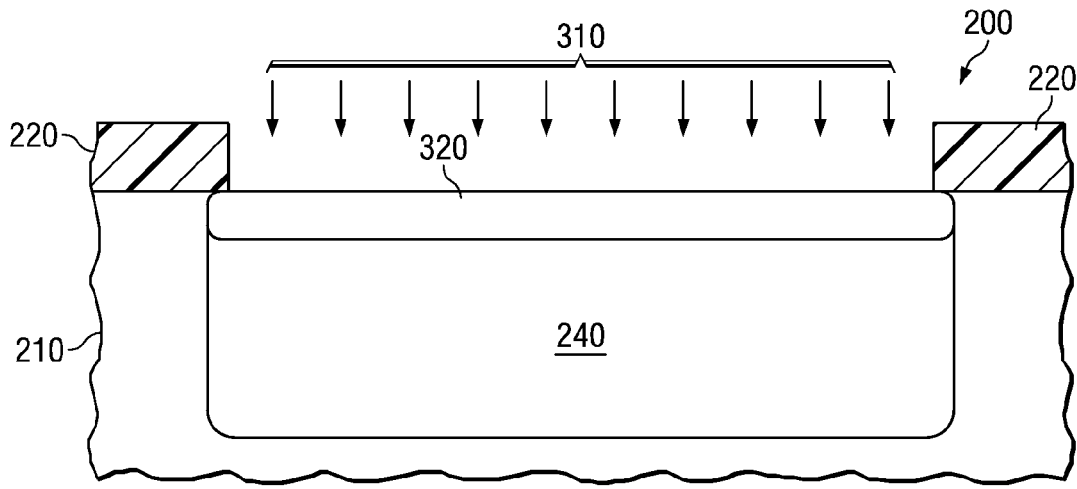

Turning now to FIG. 3, illustrated is the semiconductor device 200 of FIG. 2 after adding an additional implant 320 into the substrate 210. The additional implant 320 may also comprise many different dopants while staying within the purview of the present invention. Nevertheless, in the embodiment of FIG. 3, the additional implant 320 comprises an n-type arsenic implant.

In the illustrative embodiment of FIG. 3, the additional implant 320 is implanted into the doped well region 230 using the previously formed photoresist layer 220 and an implant dose 310. Because the same photoresist layer 220 was used to form the doped well region 240 and the additional implant 320, the additional implant 320 is located in the same lateral position as the doped well region 240. Using the photoresist layer 220, the additional implant 310 could be implanted with an arsenic dopant dose ranging from about 5E14 atoms/cm$^2$ to about 5E15 atoms/cm$^2$. Such an arsenic dose might be implanted using an energy ranging from about 50 keV to about 200 keV, among others. This results in the additional implant 310 having a peak dopant concentration ranging from about 1E19 atoms/cm$^3$ to about 1E21 atoms/cm$^3$. Because the additional implant 310 is implanted using a lesser energy than the doped well region 230, the additional implant 310 tends to be a much shallower implant.

Figure 4:
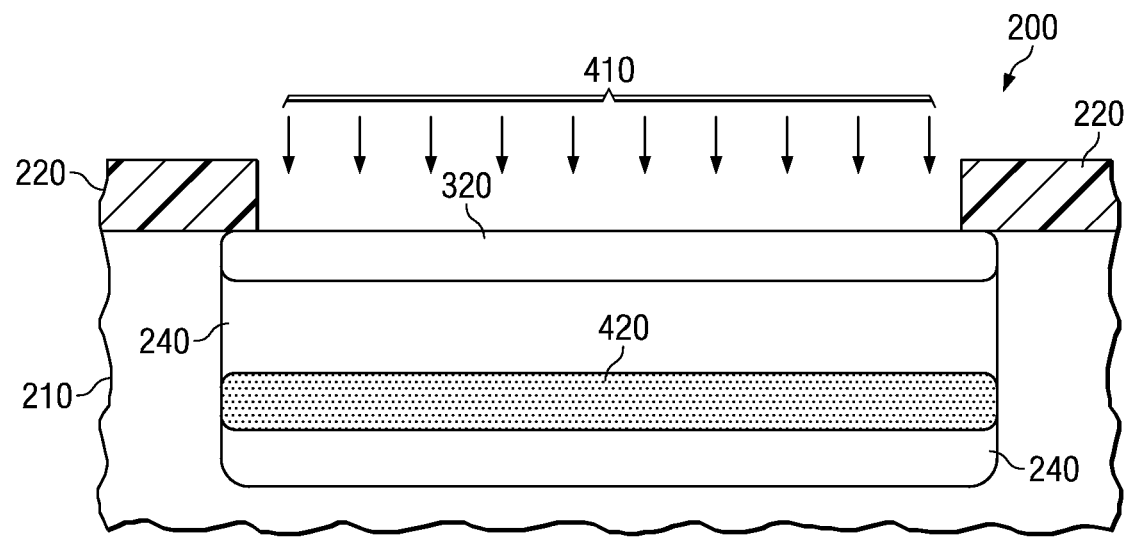

Turning now to FIG. 4, illustrated is the semiconductor device 200 of FIG. 3 after forming a suppression implant 420 within the substrate 210, and more particularly within the doped well region 240. The suppression implant 420 may comprise various different dopants. For instance, the suppression implant 420, among others, may comprise different group 14, group 15, group 17 or group 18 elements. Depending on the particular embodiment being used, the suppression implant 420 could comprise a Fluorine implant, Carbon implant, Silicon implant, Nitrogen implant, Neon implant, or Argon implant, without limitation. The embodiment of FIG. 4, however, uses the Fluorine implant for the suppression implant 420. It should also be noted that other embodiments may exist wherein combination suppression implants, for example by combining any two or more of the previously listed elements, might also be used.

The location of the suppression implant 420 within the substrate 210 is particularly important to the effectiveness thereof. In a general sense, the suppression implant 420 should be located within the doped well region 240. However, in certain embodiments the suppression implant 420 is located between a peak concentration of the doped well region 240 and the lowest portion of the active junctions 530, 630 (see FIGS. 5 and 6, discussed below). In other embodiments, the suppression implant 420 is located within about 1 micron of the peak concentration of the doped well region 240. In even further embodiments, the suppression implant 420 is located within about 0.5 microns of the peak concentration of the doped well region 240.

In the illustrative embodiment of FIG. 4, the suppression implant 420 is implanted into the doped well region 240 using the previously formed photoresist layer 220 and an implant dose 410. Because the same photoresist layer 220 was used to form the doped well region 240, the additional implant 320, and the suppression implant 420, the suppression implant 420 is located in the same lateral position as the doped well region 240 and the additional implant 320. Using the photoresist layer 220, the suppression implant 420 could be implanted, in one embodiment, with a Fluorine dopant dose of at least about 1.5E14 atoms/cm$^2$. In an alternative embodiment, the Fluorine dopant dose might range from about 1E13 atoms/cm$^2$ and up. Such Fluorine doses might be implanted using an energy ranging from about 120 keV to about 540 keV. The disclosed energy values and doses are particularly adept at positioning the suppression implant 420 in the appropriate location. The resulting suppression implant 420 would likely have a peak dopant concentration ranging from about 1E17 atoms/cm$^3$ to about 1E19 atoms/cm$^3$.

Figure 5:
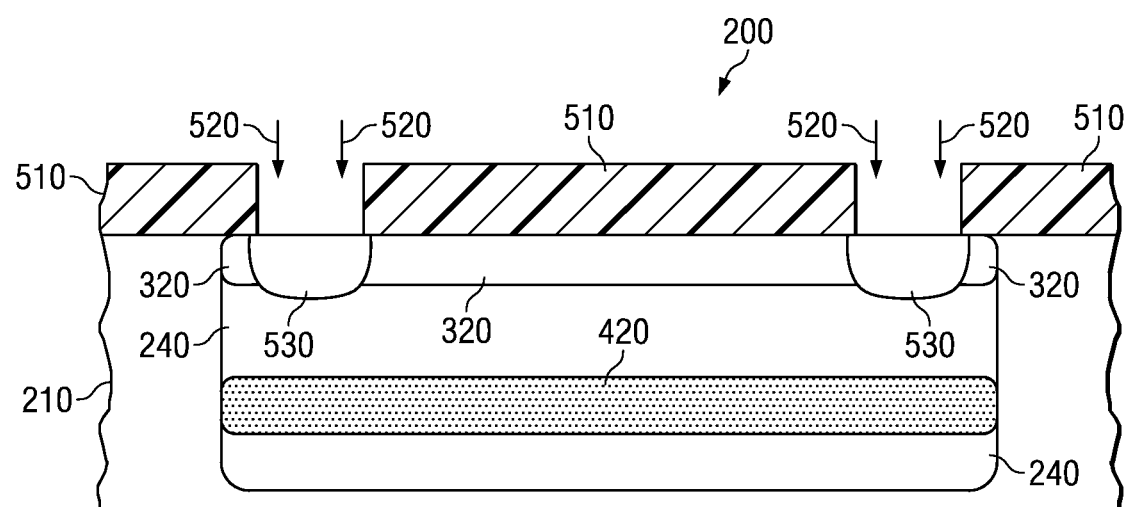

Turning now to FIG. 5, illustrated is the semiconductor device 200 of FIG. 4 after using a patterned photoresist layer 510 and implant dose 520 to form active junctions 530 within the substrate 210. The active junctions 530 illustrated in FIG. 5 happen to be anodes, as might be used in a zener diode. However, as previously mentioned, the active junctions 530 could comprise different features and remain within the purview of the present invention. Given that the active junctions 530 are configured as anodes in the embodiment of FIG. 5, the active junctions 530 might be doped with a p-type dopant, for example Boron.

The processes that might be used to form the active junctions 530 within the substrate 210 may be conventional. For example, using the photoresist layer 510, the active junctions 530 could be implanted into the substrate 210 using a dopant (e.g., Boron) dose ranging from about 5E14 atoms/cm$^2$ to about 5E15 atoms/cm$^2$. Such a dose might be implanted using an energy ranging from about 20 keV to about 110 keV. The disclosed energy values and doses are particularly able to position the active junctions 530 in the appropriate location, which in one embodiment is above the suppression implant 420. The resulting active junctions 530 would likely have a peak dopant concentration ranging from about 1E19 atoms/cm$^3$ to about 1E21 atoms/cm$^3$.

Figure 6:
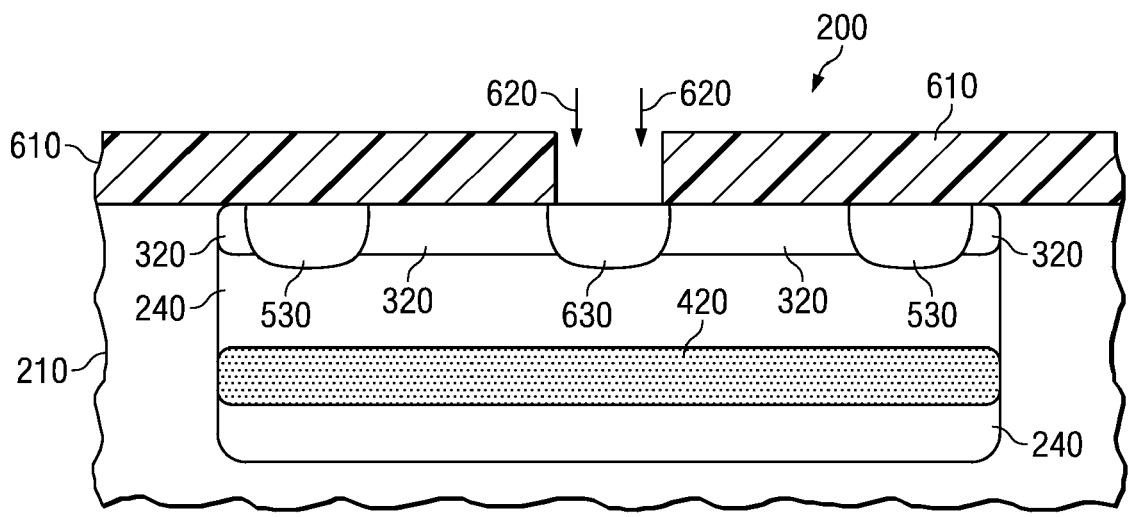

Turning now to FIG. 6, illustrated is the semiconductor device 200 of FIG. 5 after using a patterned photoresist layer 610 and implant dose 620 to form an active junction 630 within the substrate 210. Given that the semiconductor device 200 of FIG. 6 is configured as a zener diode, the active junction 630 is a cathode. Again, as previously mentioned, the active junction 630 could comprise different features and remain within the purview of the present invention. Given that the active junction 630 is configured as a cathode, the active junction 630 might be doped with an n-type dopant, for example arsenic or phosphorous.

The processes that might be used to form the active junction 630 within the substrate 210 may be conventional. For example, using the photoresist layer 610, the active junction 630 could be implanted into the substrate 210 using a dopant (e.g., arsenic or phosphorous) dose ranging from about 5E14 atoms/cm$^2$ to about 5E15 atoms/cm$^2$. Such a dose might be implanted using an energy ranging from about 20 keV to about 100 keV. The disclosed energy values and doses are particularly able to position the active junction 630 in the appropriate location, which in one embodiment is above the suppression implant 420. The resulting active junction 630 would likely have a peak dopant concentration ranging from about 5E19 atoms/cm$^3$ to about 5E21 atoms/cm$^3$.

At this point in the manufacture of the semiconductor device 200, the doped well region 240, the additional implant 320, the suppression implant 420, and the active junctions 530, 630, have likely been subjected to various anneals (or diffusions). For example, those features (e.g., features 240, 320, 42, 530 and 630) might be subjected to anneals using temperatures ranging from about 800° C. to about 1100° C. from seconds to hours to activate the features or set junction depths to desired levels. The timing of the anneals is important to the present invention. For instance, while the anneals may be conducted at various different times, they should generally be conducted before formation of the wells or after implantation of the suppression implant 420, but not between the formation of the wells and the suppression implant 420. Generally, however, such anneals would be conducted at the end of implantation processes, such that only a single anneal may be required for a given mask/implant step.

Figure 7:
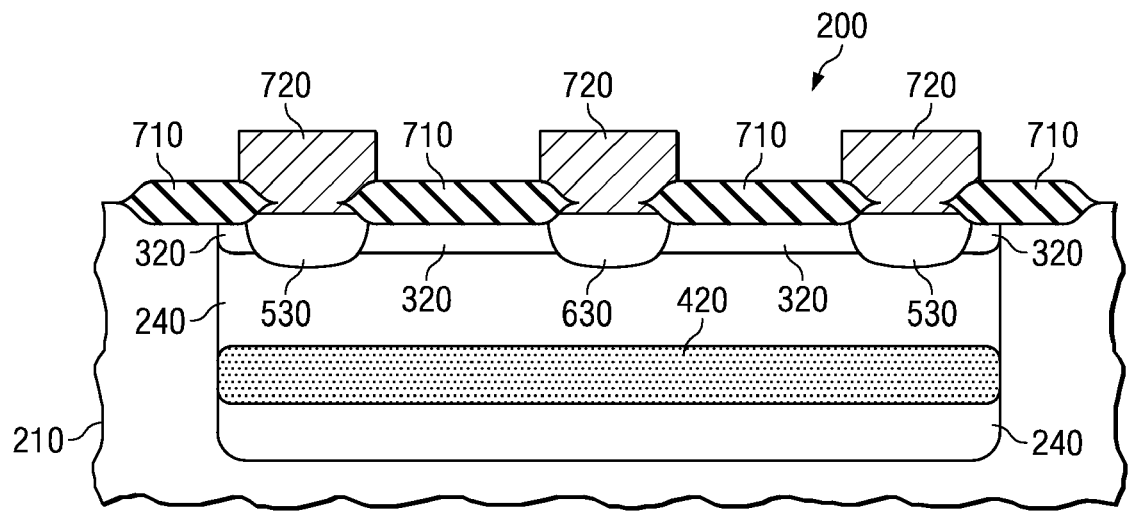

Turning lastly to FIG. 7, illustrated is the semiconductor device 200 of FIG. 6 after forming isolation structures 710 in or over the substrate 210 and contact features 720 for contacting the active junctions 530, 630. Those skilled in the art appreciate the many different processes that might be used to form the isolation structures 710 and contact features 720. Accordingly, no further detail need be given for their manufacture. After completing the isolation structures 710 and contact features 720, a device similar to the semiconductor device 100 of FIG. 1 might result.

The process for manufacturing the semiconductor device 200 illustrated in FIGS. 2 thru 7 is but one embodiment of how a semiconductor device might be manufactured in accordance with the principles of the present invention. For example, the order of formation of the doped well region 240, additional implant 320 and suppression implant 420, and for that matter even possibly the active junctions 530, 630, might be rearranged. Again, an importance is that the suppression implant 420 should be formed prior to performing any anneals directed at activating any of the previously formed features 240, 320, 530, 630.

Figure 8:
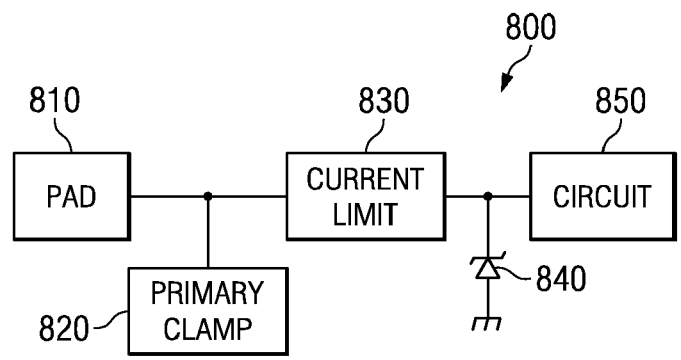
FIG. 8 illustrates a combined block diagram/schematic diagram showing an embodiment of a protection circuit utilizing a zener diode as a clamp.

Turning lastly to FIG. 8, illustrated is a combined block diagram/schematic diagram showing an embodiment of the invention, an input ESD protection circuit 800 utilizing a zener diode 840 as a clamp. In the embodiment shown, the zener diode 840 is substantially similar to the zener diode 100 illustrated in FIG. 1, as well as functions as a secondary clamp. Other embodiments of the zener diode 840, however, also exist.

In the embodiment of FIG. 8, an input pad 810 is connected to a primary clamp 820 and a current limit 830. Current limit 830 is also connected to the zener diode 840, which clamps the voltage to a level that is safe, thereby protecting the circuit 850 (particularly gate oxide or source/drain junctions of MOS transistor devices that may be located within the circuit 850).

Those skilled in the art to which the invention relates will appreciate that other and further additions, deletions, substitutions and modifications may be made to the described embodiments without departing from the scope of the invention.

What is claimed is:

1. A zener diode, comprising:
    a p-type well located within a substrate;
    a Fluorine implant located within the substrate proximate the p-type well and configured to reduce threading dislocations; and
    a cathode and an anode located within the p-type well.

2. The zener diode as recited in claim 1 wherein a peak concentration of the Fluorine implant is located between a peak concentration of the p-type well and a lowest portion of the cathode and the anode.

3. The zener diode as recited in claim 1 wherein a peak concentration of the Fluorine implant is located within about 1 micron of a peak concentration of the p-type well.

4. The zener diode as recited in claim 1 wherein the p-type well is a Boron doped well.

5. A semiconductor device, comprising:
    a doped well located within a substrate;
    one or more active junctions located within the doped well; and
    a suppression implant located within the doped well, wherein a peak concentration of the suppression implant is located between a peak concentration of the p-type well and a lowest portion of the one or more active junctions.

6. The semiconductor device as recited in claim 5 wherein the suppression implant is a Fluorine implant.

7. The semiconductor device as recited in claim 5 wherein the suppression implant is a Carbon implant, a Silicon implant, a Nitrogen implant, a Neon implant or an Argon implant.

8. The semiconductor device as recited in claim 5 wherein a peak concentration of the suppression implant is located within about 1 micron of a peak concentration of the doped well.

9. The semiconductor device as recited in claim 5 wherein the one or more active junctions are at least one of a collector, a base or an emitter of a bipolar transistor.

10. The semiconductor device as recited in claim 5 wherein the one or more active junctions are source/drain regions of a metal oxide semiconductor (MOS) device.

11. A voltage protection circuit, comprising:
    an input pad;
    one or more zener diodes electrically coupled to the input pad, the one or more zener diodes configured to clamp the input voltage, each of the one or more zener diodes comprising:
        a p-type well located within a substrate;
        a cathode and an anode located within the p-type well; and
        a suppression implant located within the substrate proximate the p-type well and configured to reduce threading dislocations; and
    a circuit for receiving the input voltage or the clamped input voltage.

* * * * *